United States Patent [19]

Smayling

[11] Patent Number: 4,628,487
[45] Date of Patent: Dec. 9, 1986

[54] DUAL SLOPE, FEEDBACK CONTROLLED, EEPROM PROGRAMMING

[75] Inventor: Michael C. Smayling, Houston, Tex.
[73] Assignee: Texas Instruments Incorporated, Dallas, Tex.
[21] Appl. No.: 640,721
[22] Filed: Aug. 14, 1984
[51] Int. Cl.$^4$ .............................................. G11C 11/34
[52] U.S. Cl. ..................................... 365/185; 365/104
[58] Field of Search ............... 365/182, 185, 218, 104; 357/23.5, 41

[56]  References Cited
U.S. PATENT DOCUMENTS
4,434,478  2/1984  Cook et al. ........................... 365/185

OTHER PUBLICATIONS

D. H. Oto et al., "High-Voltage Regulation and Process Considerations for High-Density 5 V-Only E$^2$-PROM's", IEEE Journal of Solid-State Circuits, vol. SC-18, No. 5, Oct. 1983, pp. 532-534.

Primary Examiner—Joseph A. Popek
Attorney, Agent, or Firm—John G. Graham

[57]  ABSTRACT

A floating-gate, electrically-erasable, programmable read-only memory cell is programmed or erased by a high voltage across a thin oxide area between the floating gate and the substrate. A tunnelling phenomena is produced by the high voltage. In order to protect the thin oxide from excessive stress, yet minimize programming time, the maximum electric field is controlled by a dual-slope waveform for the programming voltage Vpp. The values of slope and breakpoints for this dual-slope Vpp voltage are selected by a feedback arrangement which is responsive to process variations in threshold voltage, supply voltage, etc.

19 Claims, 9 Drawing Figures

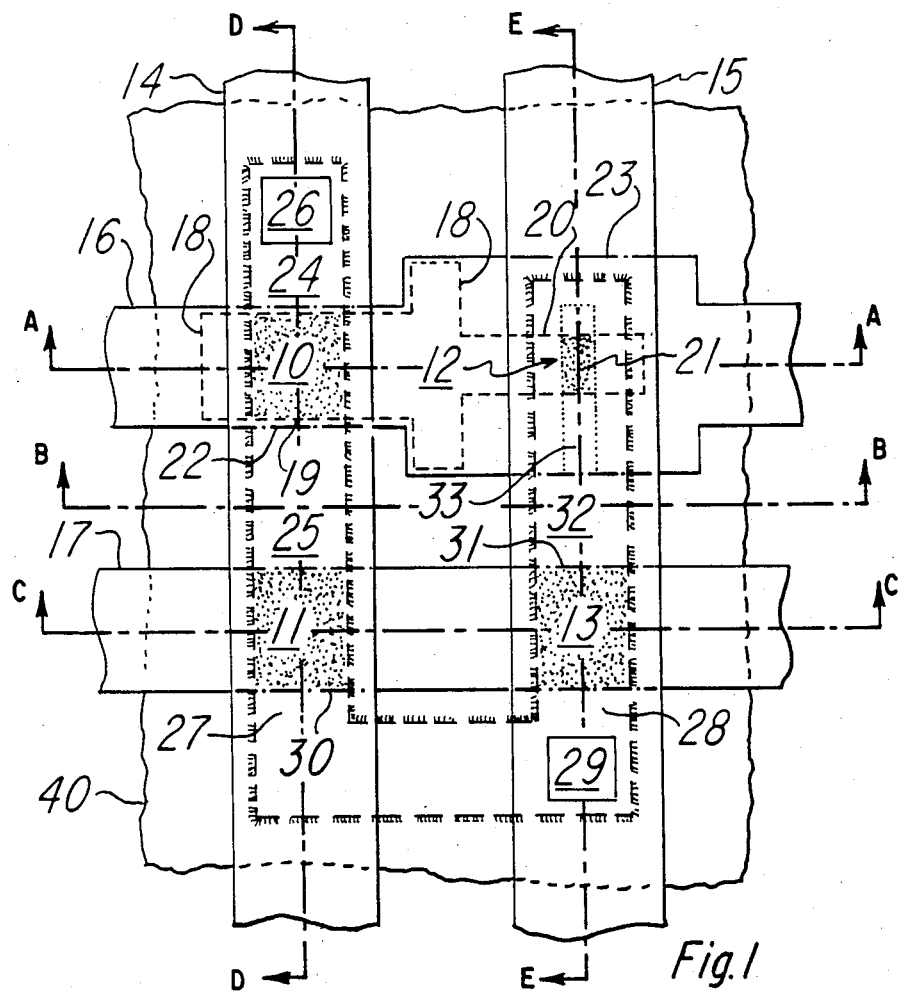
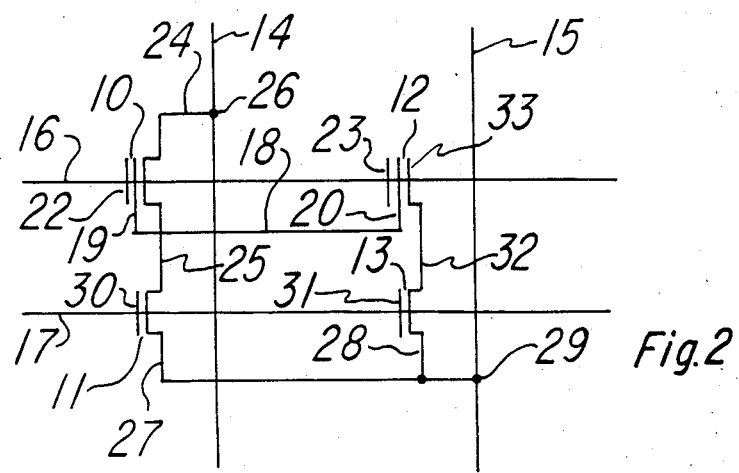
Fig. 1
Fig. 2

DUAL SLOPE, FEEDBACK CONTROLLED, EEPROM PROGRAMMING

BACKGROUND OF THE INVENTION

This invention relates to semiconductor devices, and more particularly to a method of programming a electrically-erasable programmable read-only memory (EEPROM) device.

Uncontrolled, or incorrectly controlled programming voltage (Vpp) pulses can reduce the reliability of EEPROMs by overstressing the tunnel oxide. It has been proposed to limit the maximum Vpp, and to vary the rate of increase of Vpp, by using a RC time-constant circuit to provide a waveform that rises rapidly at first, then gradually approaches the maximum; this method is disclosed by Oto el at in IEEE Journal of Solid State Circuits, Oct. 1983, pp. 532–538.

The Oto el al publication discloses a circuit for regulating the high voltage used for programming an EEPROM cell by employing an RC circuit which produces a Vpp voltage having a slope that decreases with time according to an RC time constant. This does not provide the optimum pulse shape, merely an approximation. Separate control of the maximum E field and the program pulse ramp rate are not permitted. Further, the feedback used to force the Vpp pulse to follow the RC curve was made intentionally process-independent; this necessitates use of trimming (as with a laser) at a multi-probe test station to adjust the comparison voltage in manufacture.

It is the principal object of this invention to provide an improved method of programming an EEPROM. Another object is to provide a method of controlling the Vpp voltage used in EEPROM programming in a manner which avoids overstressing the oxide at the tunnel area, yet produces optimum programming speed, and is controlled to take into account changes in supply voltage, threshold voltages, temperature, and the like.

SUMMARY OF THE INVENTION

In accordance with one embodiment of the invention, a floating-gate, electrically-erasable, programmable read-only memory cell is programmed or erased by a high voltage across a thin oxide area between the floating gate and the substrate. A tunnelling phenomena is produced by the high voltage. In order to protect the thin oxide from excessive stress, the maximum electric field is controlled by a dual-slope waveform for the programming voltage Vpp. The values of slope and breakpoints for this dual-slope Vpp voltage are selected by a feedback arrangement which is responsive to process variations in threshold voltage, supply voltage, etc.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a plan view, greatly enlarged, of a small part of a semiconductor integrated circuit containing an EEPROM cell which may be programmed according to the invention;

FIG. 2 is an electrical schematic diagram of the cell of FIG. 1;

DETAILED DESCRIPTION OF SPECIFIC EMBODIMENT

Figure 3A:
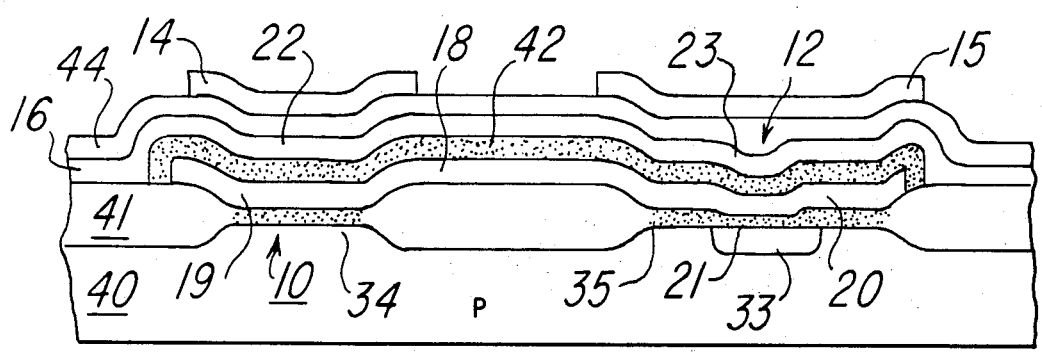
FIGS. 3A–3E are elevation views in section of the cell of FIG. 1, taken along the lines A—A, B—B, C—C, D—D, and E—E, respectively, of FIG. 1.
Figure 3B:
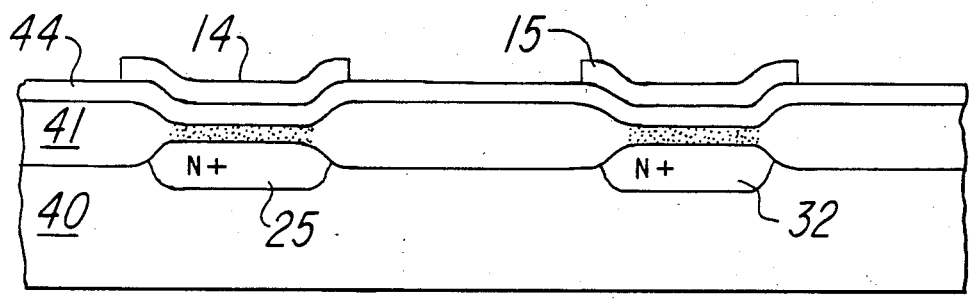
Figure 3C:
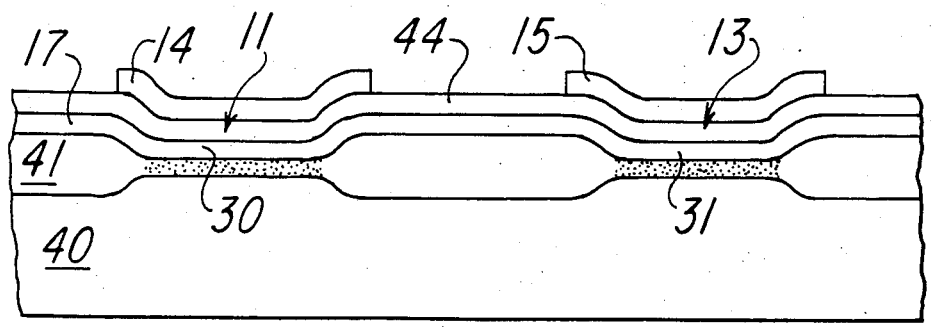
Figure 3D:
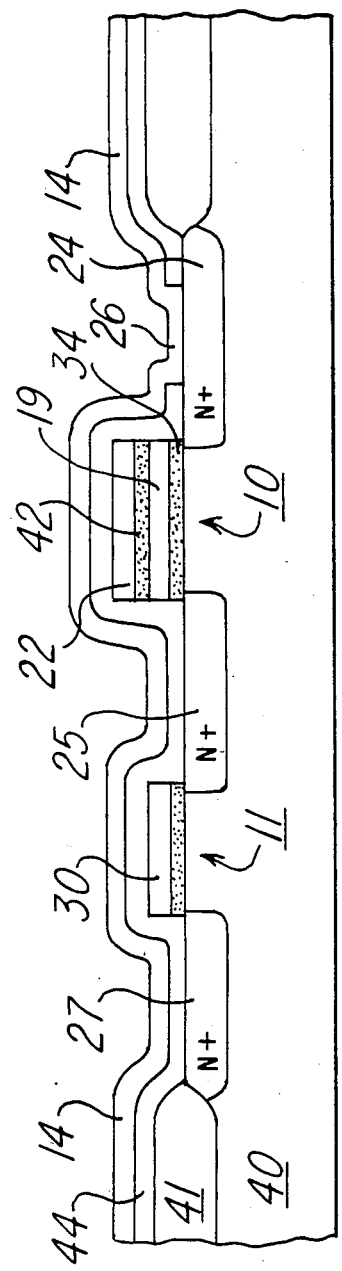
Figure 3E:
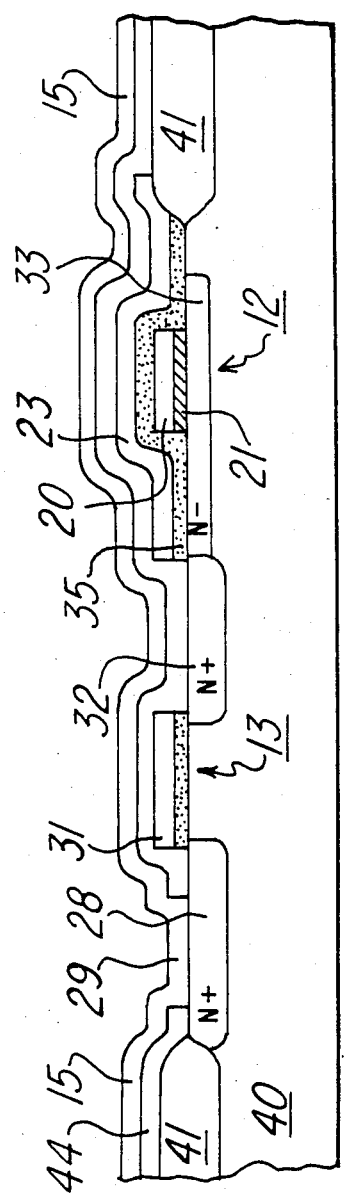

Referring to FIGS. 1, 2 and 3A–3E, an electrically erasable programmable read only memory (EEPROM) cell is shown which may utilize the dual-slope programming method of the invention. This cell consists of a floating gate memory transistor 10 in series with a read transistor 11 on one side, and a write/erase device 12 (actually a tunnel diode) in series with a write transistor 13, on the other side. This cell is of course part of an array of rows and columns of like cells, containing perhaps 32K cells partitioned as eight blocks of $128 \times 32$ cells, per block, i.e., 128 rows and thirty-two columns, providing a byte-wide output. Each cell has a metal read line 14 and a metal write line 15; these read and write lines are connected to all cells in a column. A sense line 16 and a row line 17, composed of second-level polysilicon, are common to all cells in a row. A floating gate segment 18 is composed of first-level polysilicon, and includes a floating gate 19 for the memory transistor 10 and a write/erase electrode 20 for the tunnel diode 12 at a thin-oxide area 21. The sense line 16 forms a control gate 22 for the memory transistor 10, and an upper control plate 23 of the device 12. The memory transistor 10 has an N+ drain region 24, and has an N+ source region 25 which is integral with the drain of the transistor 11. The drain 24 is connected to the read line 14 at a metal-to-silicon contact 26. The N+ source region 27 of the transistor 11 and the N+ source region 28 of the transistor 13 are both connected to the metal write line 15 at a metal-to-silicon contact 29. The polysilicon row line 17 forms the gates 30 and 31 of the N-channel enhancement mode transistors 11 and 13, respectively. The N+ drain region 32 of the transistor 13 is coupled to an N— cathode region 33 which forms the cathode of tunnel diode 12.

As seen in FIGS. 3A–3E the memory transistor 10 has a gate oxide layer 34 which is thicker, perhaps 500 Å, compared to the thin oxide area 21 of the device 12 which is of about 100 Å thickness. The device 12 operates as a tunnel diode; when the voltage between its upper plate 23 and the N— region 33 is at a level of about 20v, plus or minus, the electric field is concentrated at the thin oxide, and this electric field across the 100 Å oxide area 21 is sufficient to cause tunnelling of electrons from the region 33 to the floating gate 20, or from the floating gate 20 to the region 33, depending upon the polarity of the high voltage. No significant tunnelling occurs through the thicker oxide 35 (about 500 Å), between the plate 20 and the substrate.

The cell is formed in a P type silicon substrate 40, or in a P well in P— substrate as part of a CMOS device. A layer 41 of thick thermally-grown field oxide surrounds the transistor areas on the face of the substrate to provide isolation. Usually a P+ channel step region, not shown, would underlie all areas of the field oxide 41. The first level polycrystalline silicon segment 18 is insulated from the second level polysilicon strip 16 by an oxide coating 42 which may be deposited or thermally grown, or some of both. The metal lines 14 and 15 are insulated from the second level polysilicon lines 16 and 17 by a thick deposited oxide or phosphosilicate glaze layer 44.

Except for the device 12 having the very thin gate oxide 21, the method of making the device of FIGS. 1 and 3A–3E is very similar to the double-level polysilicon processes disclosed in U.S. Pat. No. 4,112,509 issued to Wall, U.S. Pat. No. 4,122,544 issued to McElroy, or U.S. Pat. No. 4,388,121 issued to Rao, all assigned to Texas Instruments, and all incorporated herein by reference.

The tunnel diode 12 is formed after the thick field oxide 41 is grown, and the 500 Å oxide 35 is in place. A photolithographic mask step defines the region 33, an ion implant is performed to create this N− region using photoresist as a mask, then this mask is used to remove the oxide 35 over the N− implanted region 33. A very thin oxide 21 is grown over this region, then the first level polysilicon is deposited and patterned to leave the electrode 20. The oxide 42 is grown over the first-level polysilicon, and this also thickens the oxide over the exposed part of the N− region 33. The second-level polysilicon is deposited and patterned, then the N+ source/drain implant creates the regions 24, 25, 27, 28, and 32, using second level poly as the mask for self-aligning.

Operation of the cell of FIGS. 1, 2 and 3A–3E will be explained for its three conditions: read, write, and erase. For read operations, the memory device operates with only a standard Vdd supply of +5 Vdc. For write and erase operations, a high voltage level Vpp of about +20 v is also used, with this voltage being controlled according to the invention.

To begin a read operation, the read line 14 is precharged to Vdd, and the write line 15 is connected to Vss (ground). This read line 14 can discharge to Vss through transistors 10 and 11 only if: (1) this row is selected by row line 17 going high, to Vdd, to turn on the transistor 11, and (2) the floating gate 19 of the memory transistor 10 is in a discharged state so that the Vdd voltage on the control gate 22 can turn on the channel area of this transistor. The sense line 16 is held at about +2 v during a read operation, which is about midway between a charge and discharge level of the floating gate. A sense amplifier or data output buffer detectes whether the line 14 stays at the precharge level of Vdd or discharges toward Vss, thus producing an output data bit. The tunnel diode device 12 has no function during read; the voltage across this device is not high enough for any tunnelling to take place.

In a write operation, both the sense line 16 and the row line 17 have the Vpp voltage applied; this Vpp voltage ramps up at two different rates as will be described. The selected write line 15 is coupled to Vss, so the N-"cathode" region 33 of the diode 12 is at Vss; the transistors 11 and 13 exhibit a zero voltage drop since these have Vpp on their gates. A high voltage will exist across the thin oxide area 21 between plate 23 and the N-region 33 and this field causes tunneling in the direction of electrons flowing from the region 33 upward toward the plate 23, so a charge collects, upon the floating gate. Charging of the gate is self limiting; as negative charge builds up the field decreases and tunnelling deminishes.

In an erase operation, the condition of the write operation just described are duplicated, except that the voltages on the sense line 16 and write line 15 are reversed. For write, the sense line 16 is grounded and the write line 15 is taken to Vpp (ramped as to be explained). Tunnelling will occur at the thin oxide area 21, but in this case electrons will be removed from the floating gate 18 to erase any cell that previously had a 1 written into it.

Figure 4:
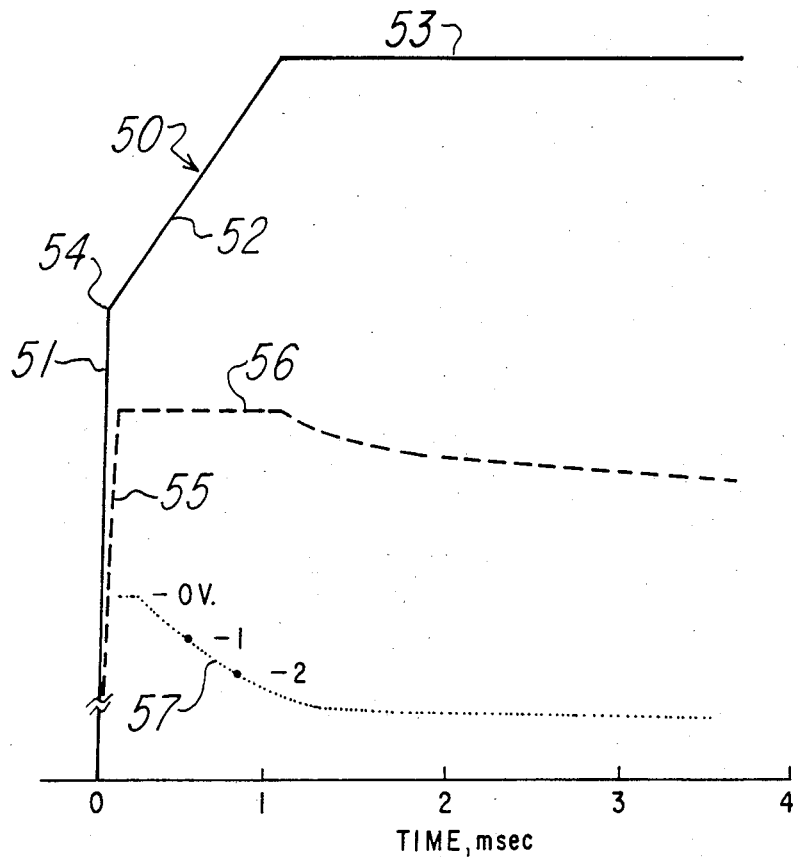
FIG. 4 is a graph of voltage vs time for the programming voltage, floating gate voltage and electric field, for programming the cell of FIGS. 1-3 according to the invention.

According to the invention, the Vpp voltage used in the write and erase operations is varied as a function of time as illustrated in FIG. 4. The voltage Vpp has a pulse waveform 50 which exhibits three distinct sections 51, 52 and 53. The voltage Vpp is brought up rapidly in the initial part 51 of a cycle to a point 54 which is selected to limit the electric field across the thin oxide 21 of the tunnel diode. This electric field is shown by a waveform 55, and is seen to rise rapidly with Vpp while Vpp is in the step slope area 51, as the parasitic capacitance of the lines is charged. A typical ramp rate for Vpp in this part of the cycle is about 0.1 V/microsec. When Vpp reaches about +16 v in this example, the field across the thin oxide 21 reaches its maximum allowable level of about 9.5 MV/cm; exceeding this level reduces the lifetime of the device, i.e. the number of write/erase cycles the device can withstand and still function within acceptable specifications. So, the Vpp pulse generator abruptly changes the ramp rate at point 54 to a slope of about 0.005 to 0.01 V/microsec, i.e., to one-tenth or less; this ramp rate in section 52 is choosen to maintain a flat E field across the thin oxide for a time as seen by the area 56 of the curve, during which the increase in Vpp is compensated by tunnelling which itself charges the voltage across the thin oxide due to the shielding effect. When the Vpp voltage reaches the maximum level of, for example, +20 v, the slope again is changed, and the pulse continues as flat in the section 53. The voltage of the floating gate 20 with respect to the cathode 33 varies according to the curve 57 of FIG. 4; starting at zero, this curve is flat until Vpp reaches a high level, then has its maximum slope while Vpp is in the ramp section 52 with the E field highest, at section 56, then flattening out when the slope of Vpp goes to zero and E begins to decrease. The Vpp pulse may as well be terminated at about 2 or 3 millisec because the amount of change in the floating gate voltage levels off at about −3.1 v.

The ramp rate of Vpp in the section 51 is chosen to be as high as possible, within the limits of the size of transistors needed to charge the parasitic capacitances, because there is no detriment to the thin oxide until the level of about 9.5 in E is reached, so the Vpp voltage may as well be brought up rapidly so the programming time is decreased. Ths slope of the section 52 is chosen to maintain the E field at its maximum, but no higher. If the slope here is too low, the programming time is needlessly increased, but if too high the lifetime of the device is decreased. The maximum level of Vpp, about +20 v, is chosen in view of various breakdown levels of oxides, junctions, etc., which are process and materials limitations.

Figure 5:
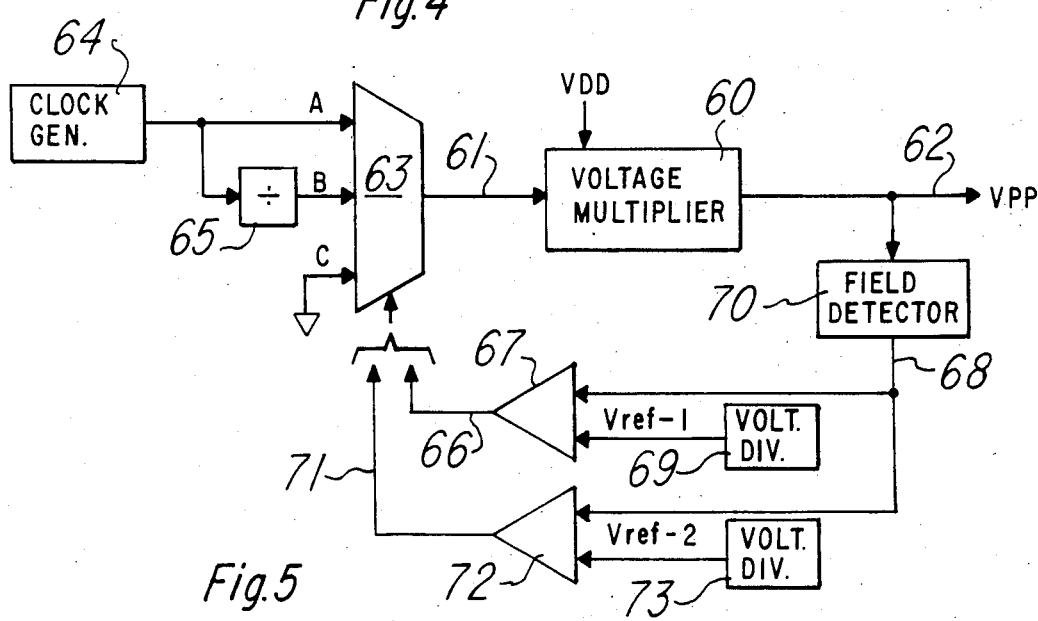
FIG. 5 is an electrical diagram of a regulator circuit for controlling Vpp according to one embodiment of the invention.

A regulator circuit for controlling the Vpp used within a given chip is illustrated in FIG. 5. Process variations require that the breakpoints be tailored to the particular device. This voltage regulator circuit employs a voltage multiplier 60 which has clock pulses applied to its input 61 and produces a voltage output on a line 62. This line is selectively connected to the sense lines 16, row lines 17 and/or write lines 15 via decoders according to standard construction of EEPROMs. The multiplier 60 is a two-phase capacitor/diode network of standard construction. The voltage Vpp output on the line 62 is directly related to the number of pulses input to the multiplier on line 61, and the slope is a function of pulse frequency. A multiplexer 63 selects three different inputs A, B and C; the input A is from an on-chip oscillator 64, of the type used as a substrate pump, while input B is from a divider 65 where the clock is divided down by, for example, 1:14 to change the slope from that of section 51 to that of section 52 of FIG. 4. The input C is ground, i.e., zero frequency, which is used when the multiplier output has charged the Vpp line 62 to the maximum voltage, e.g. +20 v, at the section 53 of the curve. The multiplex circuit receives a first input 66 from a differential detector 67 responsive to the detected field voltage on line 68 vs. the output of a first voltage divider 69 producing a reference voltage Vref-1. The divider 69 is a string of series-connected transistors connected across the internal Vdd supply, and will thus track temperature, process variations and changes in Vdd. The detected field voltage on line 68 is produced in a detector 70 which is a capacitive voltage divider constructed just like a cell of FIGS. 1-3 but with a much smaller poly-1 to poly-2 coupling area; the Vpp voltage is applied to poly-2 just as in the cell, and the voltage in poly-1 (like the floating gate) is the output 68 to be compared with a reference value Vref-1 by the differential comparator 67. Since this detector is made by the same process as the memory cells, it will track process variations such as oxide thickness. The lower capacitance ratio helps preserve the thin oxide in the field detector 70 by giving a lower E field on the tunnel oxide, which is important since the detector operates during every write/erase cycle. The other input 71 to the multiplexer 63 is from a second differential comparator 72, also responsive to the detected Vpp on line 68, vs. a second reference voltage Vref-2 from another divider 73 set for a fixed ratio of the maximum value of Vpp. A cycle of producing a Vpp pulse starts with Vpp at Vdd, and the detected Vpp on line 68 is below both trip points of comparators 67 and 72, so the inputs 66 and 71 to the multiplexer cause the A input, the full-frequency clock, to be applied to the multiplexer, so the Vpp voltage ramps up at its maximum rate, section 51 of the waveform. When the first trip point is reached, comparator 67 produces an input to the multiplexer 63 and the divided-down input B is coupled through to the multiplier, resulting in a slower ramp rate, section 52. Then, when the second trip point is reached, the input 71 causes the multiplexer to use input C, and no pulses are coupled through to the multiplier, and the output Vpp stays constant, section 53. If Vpp then decays below the desired maximum, the comparator 72 senses this, and pulses from input B are again applied to bring the level back up.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of programming a floating gate memory cell of the type having a thin-oxide area between a floating gate and another electrode, comprising the steps of:
applying a voltage to said memory cell to produce an electric field across said thin-oxide area, and increasing said voltage substantially linearly as a function of time at a first rate, abruptly changing the rate of increase of said voltage to a second rate lower than said first rate and then continuing to increase said voltage substantially linearly, then again abruptly ceasing said increase of voltage and thereafter maintaining said voltage constant at a given maximum level for a selected time.

2. A method according to claim 1 wherein said step of changing the rate is in response to reaching a maximum value of electric field across said thin-oxide area.

3. A method according to claim 2 wherein said second rate is selected to maintain a relatively constant electric field across said thin-oxide area.

4. A method according to claim 3 wherein said second rate is less than about one-tenth that of the first rate.

5. A method according to claim 4 wherein said first rate is the maximum permitted by the parasitic capacitance of the circuitry of the device containing the memory cell.

6. A method according to claim 3 wherein said given maximum level is selected based upon measuring said voltage.

7. A method according to claim 2 wherein said step of changing the rate is implemented in response to detecting the voltage across said thin-oxide area.

8. A method according to claim 2 wherein said memory cell includes a memory transistor formed at a face of a semiconductor body and having a control gate, a floating gate and a source-to-drain path, and wherein said floating gate extends to a programming area spaced from said memory area, the thin-oxide area being in said programming area.

9. A method according to claim 8 wherein said control gate extends to said programming area, and said voltage is applied between said control gate and said electrode.

10. A method according to claim 9 wherein said electrode is a region in said face.

11. An electrically-erasable, programmable, semiconductor memory cell comprising:
a control gate, a floating gate and a source-to-drain path at a face of a semiconductor body,
write/erase means at said face including an upper electrode integral with said floating gate, and a lower electrode in said face, with a thin oxide area between the upper and lower electrodes,
means for applying a programming pulse across said thin-oxide area, said pulse including a first substantially linear ramp period of increasing voltage followed by a second substantially linear ramp period of increasing voltage followed by a period of constant voltage, and abruptly changing from the first to the second at a time related to the electric field across said thin-oxide area.

12. A device according to claim 11 wherein the voltage of said pulse during said second ramp period increases at substantially linear rate much greater than that of said first ramp period.

13. A device according to claim 12 wherein said write/erase means includes a conductive layer integral with said control gate and overlying said upper and lower electrodes.

14. A device according to claim 13 wherein said pulse is applied between said conductive layer and said lower electrode, and said lower electrode is a region of said semiconductor body.

15. A device according to claim 14 wherein said floating gate is charged or discharged by tunnelling through said thin-oxide area.

16. A device according to claim 15 including detector means responsive to the electric field across said thin-oxide area, and means for controlling said time of changing from the first to second ramp period in response to said detector means.

17. A device according to claim 16 wherein the rate of change of voltage of said pulse during the second ramp period is no more than about one-tenth that of said pulse during the first ramp period.

18. A device according to claim 17 including means for limiting the maximum value of voltage of said pulse after said second period in response to the field across said thin-oxide area.

19. A device according to claim 16 wherein said detector means is responsive to temperature, supply voltage, and process variations in the threshold voltage of transistors on the semiconductor body.

* * * * *